(12) United States Patent
Lee et al.

(10) Patent No.: US 9,209,399 B2
(45) Date of Patent: Dec. 8, 2015

(54) DEVICE FOR FORMING THIN LAYER AND METHOD OF MANUFACTURING ORGANIC LIGHT EMITTING DIODE DISPLAY USING THE SAME

(71) Applicants: Sang-Jo Lee, Yongin (KR); Sung-Hwan Cho, Yongin (KR)

(72) Inventors: Sang-Jo Lee, Yongin (KR); Sung-Hwan Cho, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 184 days.

(21) Appl. No.: 13/955,684

(22) Filed: Jul. 31, 2013

(65) Prior Publication Data

US 2014/0038330 A1   Feb. 6, 2014

(30) Foreign Application Priority Data

Aug. 6, 2012   (KR) .......................... 10-2012-0085987

(51) Int. Cl.
*H01L 21/00* (2006.01)
*H01L 51/00* (2006.01)
*H01L 51/56* (2006.01)

(52) U.S. Cl.
CPC ............. *H01L 51/0005* (2013.01); *H01L 51/56* (2013.01)

(58) Field of Classification Search
CPC ...... H01L 51/0005; H01L 51/50; H01L 51/56
USPC .............................. 438/27, 28, 29, 30, 34, 35
See application file for complete search history.

(56) References Cited

U.S. PATENT DOCUMENTS

| | | | |
|---|---|---|---|
| 7,067,170 B2 * | 6/2006 | Marcus et al. ................... | 427/66 |
| 8,518,728 B2 * | 8/2013 | Kanno et al. ..................... | 438/29 |
| 8,707,889 B2 * | 4/2014 | Lee et al. ....................... | 118/213 |
| 2001/0006827 A1 * | 7/2001 | Yamazaki et al. .............. | 438/30 |
| 2002/0009538 A1 * | 1/2002 | Arai ................................ | 427/66 |

FOREIGN PATENT DOCUMENTS

| | | |
|---|---|---|
| JP | 2008-246328 | 10/2008 |
| KR | 10-2008-0065769 A | 7/2008 |
| KR | 10-2010-0098191 A | 9/2010 |

* cited by examiner

*Primary Examiner* — Kevin M Picardat
(74) *Attorney, Agent, or Firm* — Lee & Morse, P.C.

(57) ABSTRACT

Provided are a device for forming a thin layer that may be applied to mass production and a method of manufacturing a display using the same. The device for forming a thin layer includes a vessel that has a material for forming a thin layer, a multi-nozzle part that is on a substrate and that is connected to the vessel to receive the material for forming the thin layer, which multi-nozzle part includes a plurality of nozzles arranged in parallel at a distance from each other, and a pulse generator that applies a switching voltage to one of the substrate and the multi-nozzle part such that an instantaneous potential difference between at least one of the plurality of nozzles and the substrate is provided, and such that a discharge of the material for forming the thin layer is controlled.

4 Claims, 9 Drawing Sheets

DEVICE FOR FORMING THIN LAYER AND METHOD OF MANUFACTURING ORGANIC LIGHT EMITTING DIODE DISPLAY USING THE SAME

CROSS-REFERENCE TO RELATED APPLICATION

This application claims priority under 35 U.S.C. §119 to Korean Patent Application No. 10-2012-0085987 filed in the Korean Intellectual Property Office on Aug. 6, 2012, the entire contents of which are incorporated herein by reference.

BACKGROUND

An organic light emitting diode display has advantages in that a wide viewing angle, excellent contrast, and a rapid response speed may be realized without using a separate light source, unlike a liquid crystal display.

SUMMARY

Embodiments may be realized by providing a device for forming a thin layer that includes a vessel, a multi-nozzle part, and a pulse generator. The vessel stores a material for forming a thin layer. The multi-nozzle part is disposed on a substrate, connected to the vessel to receive the material for forming a thin layer, and includes a plurality of nozzles arranged in parallel at a distance from each other. The pulse generator applies switching voltage to any one of the substrate and the multi-nozzle part to provide an instantaneous potential difference between at least one of the plurality of nozzles and the substrate, thereby controlling a discharge of the material for forming a thin layer.

The plurality of nozzles may be arranged in parallel along a first direction and at least one of the multi-nozzle part and the substrate may be movably disposed along a second direction intersecting the first direction.

The vessel, which is a single vessel, may store a kind of material for forming a thin layer and the plurality of nozzles may be connected to the vessel to receive the same material for forming a thin layer. The material for forming a thin layer may be a material for forming a light emitting layer having any one color of red, green, and blue or a material for forming any one of the intermediate layers of a hole injection layer, a hole transport layer, an electron transport layer, and an electron injection layer.

The vessel may be configured of a plurality of vessels in which different materials for forming a thin layer are included and the plurality of nozzles may each be connected to any one of the plurality of vessels. The vessel may include a first vessel in which a material for forming a red light emitting layer is included, a second vessel in which a material for forming a green light emitting layer is included, and a third vessel in which a material for forming a blue light emitting layer is included.

The pulse generator may sequentially or randomly apply the switching voltage to the plurality of nozzles. The plurality of nozzles may be separated into a plurality of groups and the switching voltage may be simultaneously applied to the plurality of groups. The pulse generator may sequentially or randomly apply the switching voltage to the plurality of nozzles in the plurality of groups, respectively.

The pulse generator may be electrically connected to sub-pixel areas of the substrate to apply the switching voltage to the sub-pixel areas.

The substrate may be provided with scan lines and data lines that intersect each other and the sub-pixel areas may be separated into the plurality of groups along a direction in parallel with the scan lines and a plurality of pad parts connected to at least one of the sub-pixel areas in the plurality of groups, respectively. The pulse generator may be electrically connected to the plurality of pad parts, respectively.

The pulse generator may sequentially or randomly apply the switching voltage to the plurality of pads, respectively, in each group.

Embodiments may also be realized by providing a method of manufacturing an organic light emitting diode display that includes disposing a multi-nozzle part having a plurality of nozzles on a substrate, providing a material for forming a thin layer stored in a vessel to the multi-nozzle part, and generating switching voltage from a pulse generator and applying the switching voltage to any one of the substrate and the multi-nozzle part to generate an instantaneous potential difference between at least one of the plurality of nozzles and the substrate. At least one nozzle discharges a material for forming a thin layer due to the potential difference to form a thin layer.

The pulse generator may sequentially or randomly apply the switching voltage to the plurality of nozzles. The plurality of nozzles may be separated into a plurality of groups and the pulse generator may sequentially or randomly apply the switching voltage to the plurality of nozzles in the plurality of groups, respectively. The pulse generator may be electrically connected to sub-pixel areas of the substrate to apply the switching voltage to the sub-pixel areas.

DETAILED DESCRIPTION

Hereinafter, embodiments will be described more fully hereinafter with reference to the accompanying drawings, in which exemplary embodiments of the invention are shown. As those skilled in the art would realize, the described embodiments may be modified in various different ways, all without departing from the spirit or scope of the exemplary implementations.

Figure 1:
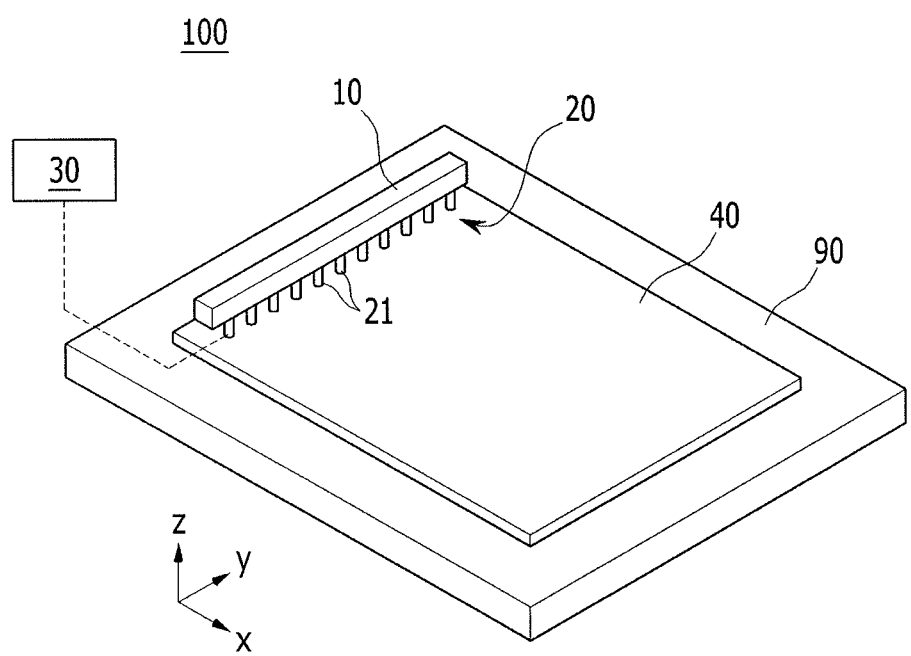
FIG. 1 is a schematic diagram schematically illustrating a device for forming a thin layer according to an exemplary embodiment.

FIG. 1 is a schematic diagram schematically illustrating a device for forming a thin layer according to a first exemplary embodiment.

Referring to FIG. 1, a device 100 for forming a thin layer according to the first exemplary embodiment includes a vessel 10 in which a material for forming a thin layer is included, a multi-nozzle part 20 configured of a plurality of nozzles 21, and a pulse generator 30 electrically connected to the plurality of nozzles 21, respectively. For convenience, FIG. 1 schematically illustrates that the pulse generator 30 is electrically connected to the single nozzle 21.

The vessel 10, which is a single vessel, stores a kind of thin layer forming material. For example, the vessel 10 may store a material for forming a light emitting layer of any one of red, green, and blue and a material for forming any one of intermediate layers, such as a hole injection layer (HIL), a hole transport layer (HTL), an electron transport layer (ETL), an electron injection layer (EIL), and the like.

The multi-nozzle part 20 is disposed on a substrate 40 and is connected to the vessel 10 to be supplied with a material for forming a thin layer. The multi-nozzle part 20 is disposed at one portion of the vessel 10 or is disposed so as to be spaced apart from the vessel, and may be connected to the vessel through a hose (not illustrated). FIG. 1 illustrates, by way of example, a case in which the multi-nozzle part 20 is mounted at one portion of the vessel 10. The plurality of nozzles 21 are arranged in parallel at a distance along a first direction (a y-axis direction of FIG. 1).

At least one of the multi-nozzle part 20 and the substrate 40 is movably mounted along a second direction (an x-axis direction of FIG. 1) intersecting the first direction. For example the second direction may be perpendicular to the first direction. At least one of the multi-nozzle part 20 and the substrate 40 may be provided with a stage. FIG. 1 illustrates, by way of example, a case in which the substrate 40 is mounted on a stage 90 to move along the second direction.

The multi-nozzle part 20 discharges the material for forming a thin layer toward the substrate 40 to form a thin layer on the substrate 40. The thin layer may be a light emitting layer of any one of red, green, and blue and may be any one of the intermediate layers such as a hole injection layer, a hole transport layer, an electron transport layer, an electron injection layer, and the like. The thin layer is formed by a charge patterning method using a potential difference between the nozzle 21 (and a material for forming a thin layer therethrough) and the substrate 40. The detailed method of forming a thin layer will be described below in detail.

Figure 2:
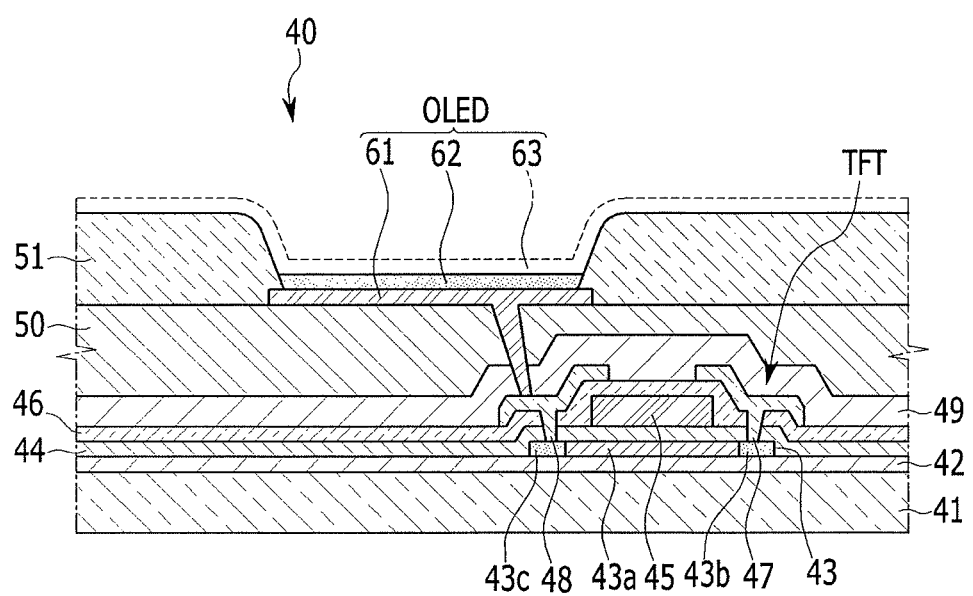
FIG. 2 is a cross-sectional view schematically illustrating a single sub-pixel area of the substrate in FIG. 1.

FIG. 2 is a cross-sectional view schematically illustrating a substrate illustrated in FIG. 1, which illustrates a single sub-pixel area.

Referring to FIG. 2, the substrate 40 includes a base substrate 41, and a thin layer transistor (TFT) and a pixel electrode 61 that are formed over the base substrate 41. The base substrate 41 may be formed of, e.g., a glass plate or a plastic film. A buffer layer 42 may be disposed on the base substrate 41.

An active layer 43 including a channel area 43a, a source area 43b, and a drain area 43c may be disposed on the buffer layer 42. A gate insulating layer 44 may be disposed on the active layer 43. A gate electrode 43 may be formed on the gate insulating layer 44 on the channel region 43a. An interlayer insulating layer 46 may cover the gate electrode 45. A source electrode 47 and a drain electrode 48 are disposed on the interlayer insulating layer 46, and the source electrode 47 and the drain electrode 48 are each connected to the source area 43b and the drain area 43c, respectively, through contact holes in the interlayer insulating layer 46.

A passivation layer 49 may be disposed on the source electrode 47 and the drain electrode 48. A planarization layer 50 may be formed on the passivation layer 49. The passivation layer 49 may be formed of inorganic matters, such as $SiO_2$, $SiN_x$, and the like, and the planarization layer 50 may be formed of organic materials, such as polyimide, benzocyclobutene, and the like. A pixel electrode 61 may be formed on the planarization layer 50. The pixel electrode 61 may be connected to the drain electrode 48 through a via hole in the planarization layer 50 and the passivation layer 49.

A pixel definition layer 51 may be disposed on the pixel electrode 61 and the planarization layer 50. A part or the whole of the pixel electrode 61 may be exposed through an opening of the pixel defined layer 51. The pixel electrode 61 may be an anode that injects holes or and a cathode that injects electrons.

According to exemplary embodiments, the material for forming any one of the light emitting layers of red, green, and blue is discharged from the multi-nozzle part 20 toward the exposed pixel electrode 61, thereby forming the light emitting layer 62. According to other exemplary embodiments, the material for forming any one of the intermediate layers, such as the hole injection layer, the hole transport layer, the electron transport layer, the electron injection layer, and the like, may be discharged from the multi-nozzle part 20 to form the intermediate layer.

According to an exemplary embodiment, the hole injection layer and the hole transport layer may be formed before the light emitting layer 62 is formed, and the electron transport layer and the electron injection layer may be formed after the light emitting layer 62 is formed. Alternatively, the electron injection layer and the electron transport layer may be formed before the light emitting layer 62 is formed, and the hole transport layer and the hole injection layer may be formed after the light emitting layer 62 is formed.

The light emitting layer 62 and the pixel defined layer 51 may be covered with a common electrode 63. The common electrode 63 may be formed all over substrate 40, and may be formed in a process after the thin layer is formed by, e.g., the device 100 illustrated in FIG. 1 or another device. The pixel electrode 61, the light emitting layer 62, and the common electrode 63 may configure or constitute the organic light emitting diode (OLED). When the pixel electrode 61 is an anode, the common electrode 63 becomes a cathode. When the pixel electrode 61 is a cathode, the common electrode 63 becomes an anode.

Figure 3:
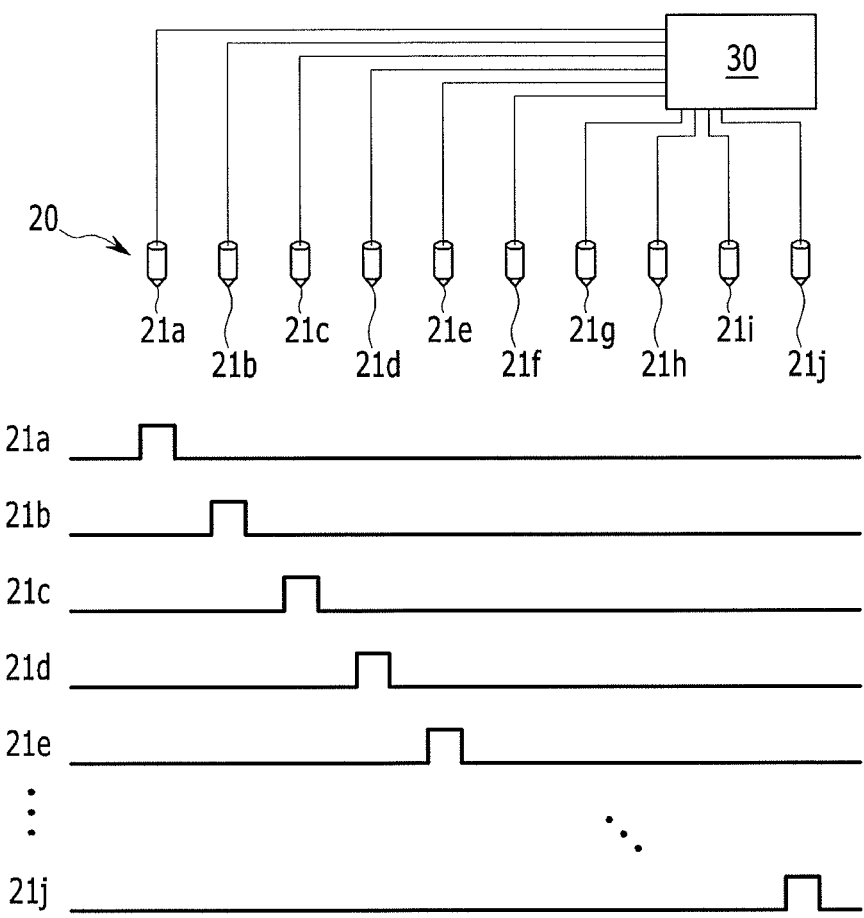
FIG. 3 is a schematic diagram illustrating a configuration of a multi-nozzle part and a pulse generator in the device for forming a thin layer illustrated in FIG. 1 and illustrating the switching voltage applied from the pulse generator to a plurality of nozzles.

FIG. 3 is a schematic diagram illustrating a configuration of a multi-nozzle part and a pulse generator in a device for forming a thin layer illustrated in FIG. 1 and switching voltage applied from the pulse generator to a plurality of nozzles.

Referring to FIGS. 1 and 3, the pulse generator 30 is electrically connected to a plurality of nozzles 21a to 21j to generate the switching voltage and apply the switching voltage to the plurality of nozzles 21a to 21j, respectively, at a time difference. By this configuration, an instantaneous potential difference occurs between any one of the plurality of nozzles 21a to 21j and the substrate 40, and the material for forming a thin layer is discharged through the nozzle. That is, all of the nozzles 21a to 21j are not simultaneously applied with the switching voltage. For example, each of the plurality of nozzles 21a to 21j are applied with the switching voltage at different times so that the material for forming the thin layer is discharged at different times.

When the plurality of nozzles 21a to 21j are simultaneously applied with the same voltage, electric field interference occurs between adjacent nozzles, such that a moving path of the material for forming a thin layer discharged from the nozzle is changed. As a result, it is not possible to accurately print the material for forming a thin layer at a desired location. However, according to the first exemplary embodiment, the nozzles 21a to 21j are applied with the switching voltages at a time difference therebetween, such that the effects of the electric field interference between the adjacent nozzles may be minimized.

The switching voltage may be sequentially applied to the plurality of nozzles 21a to 21j. That is, the switching voltage may be sequentially applied from the nozzle 21a that is disposed at one portion of the multi-nozzle part 20 to the nozzle 21j that is disposed at an opposite portion thereto. In this case, the substrate 40 maintains relative lower potential than the plurality of nozzles 21a to 21j. Therefore, the potential difference sequentially occurs between the first nozzle 21a and the substrate 40 through between the last nozzle 21j and the substrate 40 to sequentially discharge the material for forming a thin layer.

By the foregoing method, the light emitting layer or the intermediate layer may be formed in the sub-pixel areas that are located at one column on the substrate 40. Thereafter, any one of the substrate 40 and the multi-nozzle part 20 moves along the second direction and the switching voltage is sequentially applied to the plurality of nozzles 21a to 21j, such that the light emitting layer or the intermediate layer may be formed in the sub-pixel areas that are located in the next column. By this process, the emission layer or the intermediate layer may be formed all over the substrate 40.

As such, the device 100 for forming a thin layer according to the first exemplary embodiment uses the pulse generator 30 to sequentially apply the switching voltage to the plurality of nozzles 21a to 21j. Therefore, it is possible to accurately print the material for forming a thin layer at a desired location by minimized and/or preventing electrical field interference between the adjacent nozzles. Further, it is possible to effectively shorten the printing time and reduce the dryness between a pre-printing area and a post-printing area to increase light emitting uniformity, as compared with the single nozzle structure according to the related art.

Figure 4:
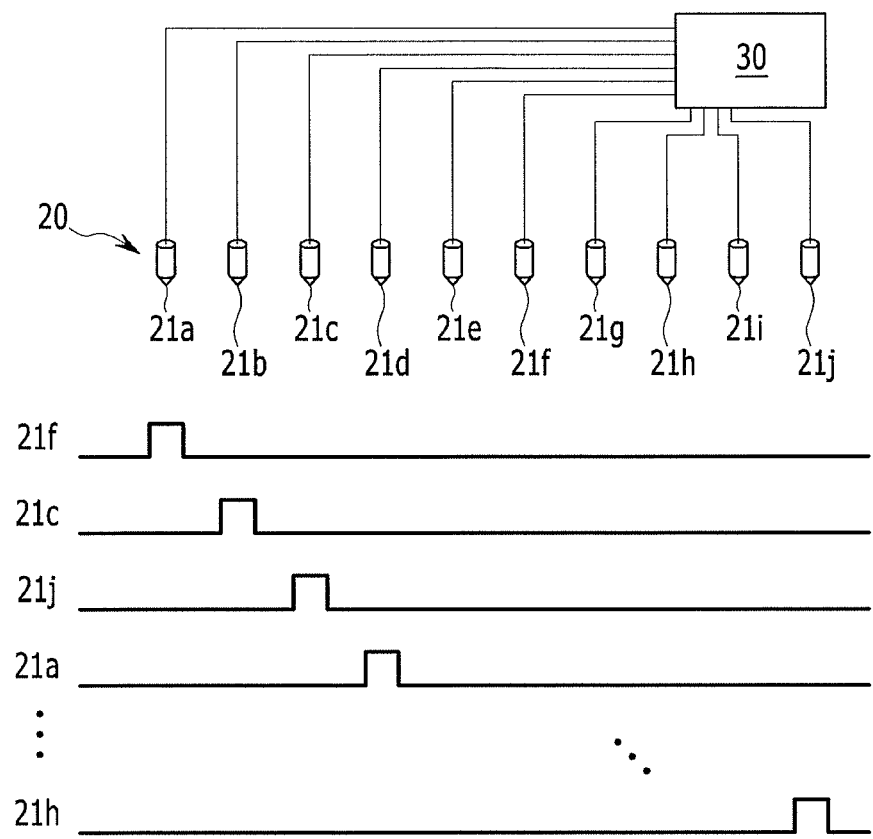
FIG. 4 is a schematic diagram illustrating a configuration of a multi-nozzle part and a pulse generator in a device for forming a thin layer according to an exemplary embodiment and illustrating a switching voltage applied from the pulse generator to the plurality of nozzles.

FIG. 4 is a schematic diagram illustrating a configuration of a multi-nozzle part and a pulse generator in a device for forming a thin layer according to a second exemplary embodiment and switching voltage applied from the pulse generator to the plurality of nozzles.

Referring to FIG. 4, the device for forming a thin layer according to the second exemplary embodiment has the same configuration as the first exemplary embodiment as described above, except that the switching voltage is randomly applied from the pulse generation 30 to the plurality of nozzles 21a to 21j. The components described in the first exemplary embodiment are denoted by the same reference numerals.

The switching voltage is randomly applied to the plurality of nozzles 21a to 21j. In this way, the material for forming a thin layer is randomly discharged from the multi-nozzle part while the potential difference between any one nozzle to which the switching voltage is applied and the substrate 40 instantaneously occurs. Even in this case, it is possible to accurately print the material for forming a thin layer at a desired location minimizing and/or preventing electrical field interference between the adjacent nozzles.

Figure 5:
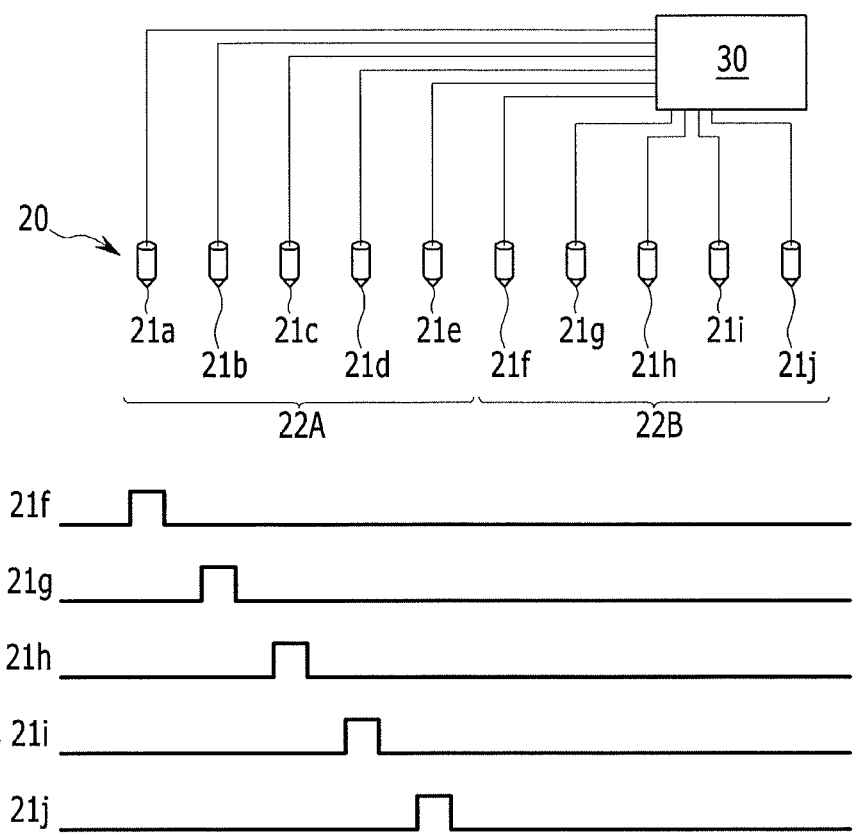
FIG. 5 is a schematic diagram illustrating a configuration of a multi-nozzle part and a pulse generator in a device for forming a thin layer according to an exemplary embodiment and illustrating a switching voltage applied from the pulse generator to the plurality of nozzles.

FIG. 5 is a schematic diagram illustrating a configuration of a multi-nozzle part and a pulse generator in a device for forming a thin layer according to a third exemplary embodiment and switching voltage applied from the pulse generator to the plurality of nozzles.

Referring to FIG. 5, the device for forming a thin layer according to a third exemplary embodiment is configured to have the same configuration as the first exemplary embodiment as described above except that the plurality of nozzles 21a to 21j are separated from at least two groups 22A and 22B, and the switching voltage is sequentially applied to the plurality of nozzles 21a to 21j within each of the groups 22A and 22B. The components described in the first exemplary embodiment are denoted by the same reference numerals.

For example, the groups 22A and 22B may include of the plurality of nozzles 21a to 21e and 21f to 21j, respectively, which are disposed adjacent to each other. For example, the plurality of nozzles 21a to 21j may be separated into the first group 22A corresponding to the left of the multi-nozzle part 20, and the second group 22B corresponding to the right of the first group 22A. Further, the switching voltage is sequentially applied to the nozzles 21f to 21j of the second group 22B while being sequentially applied to the nozzles 21a to 21e of the first group 22A. For example, the switching voltage may be sequentially applied to the nozzles 21a to 21e in the first group 22A, and at the same time the switching voltage may be sequentially applied to the nozzles 21f to 21j in the second group 22B.

Therefore, the material for forming a thin layer is simultaneously discharged from the nozzles 21a to 21e of the first group 22A and the nozzles 21f to 21j of the second group 22B at specific times. In this case, the nozzles 21a to 21e of the first group 22A and the nozzles 21f to 21j of the second group 22B, to which the switching voltage is applied at a specific timing, may be spaced apart from each other as much as a distance so as not to be affected by an electrical field.

The device for forming a thin layer according to the third exemplary embodiment may accurately print the material for forming a thin layer at a desired location and may reduce the time taken to form the light emitting layer or the intermediate layer in the sub-pixel areas located at one column by half, as compared with the first exemplary embodiment as described above.

Figure 6:
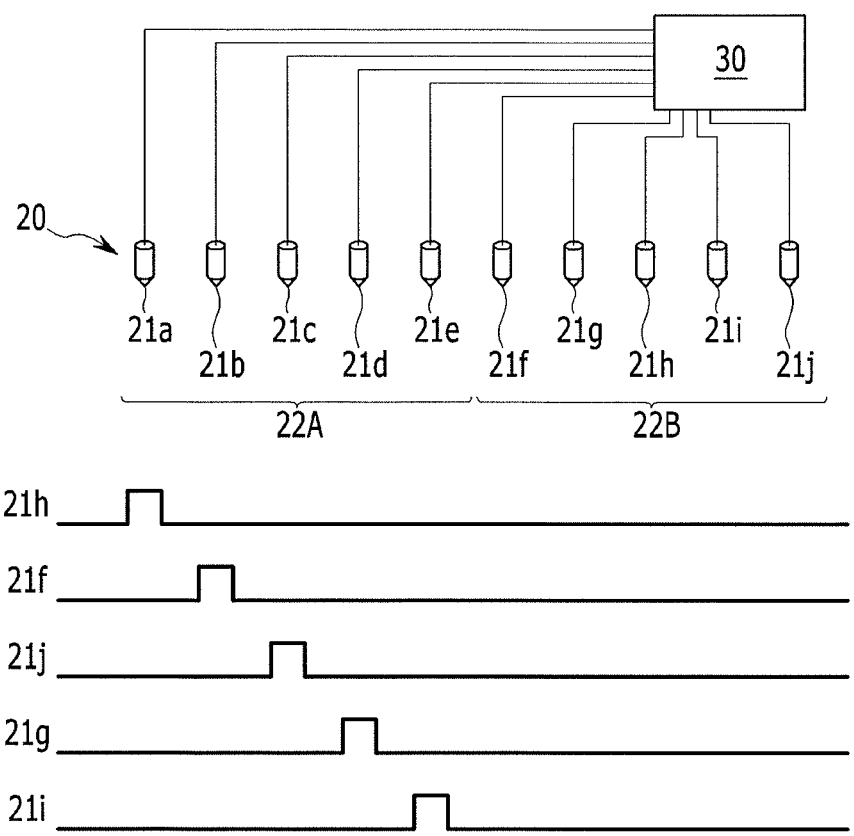
FIG. 6 is a schematic diagram illustrating a configuration of a multi-nozzle part and a pulse generator in a device for forming a thin layer according to an exemplary embodiment and illustrating a switching voltage applied from the pulse generator to the plurality of nozzles.

FIG. 6 is a schematic diagram illustrating a configuration of a multi-nozzle part and a pulse generator in a device for forming a thin layer according to a fourth exemplary embodiment and switching voltage applied from the pulse generator to the plurality of nozzles.

Referring to FIG. 6, the device for forming a thin layer according to the fourth exemplary embodiment has the same configuration as the device for forming a thin layer according to the third exemplary embodiment as described above, except that the switching voltage is randomly applied to the plurality of nozzles 21a to 21e and 21f to 21j of groups 22A and 22B, respectively. The components described in the third exemplary embodiment are denoted by the same reference numerals.

When the plurality of nozzles 21a to 21j are separated into the first group 22A and the second group 22B, the switching voltage may be randomly applied to the nozzles 21f to 21j of the second group 22B while being randomly applied to the nozzles 21a to 21e of the first group 22A. Therefore, the material for forming a thin layer is simultaneously discharged from the nozzles 21a to 21e of the first group 22A and the nozzles 21f to 21j of the second group 22B at a specific timing. The nozzles 21a to 21e of the first group 22A and the nozzles 21f to 21j of the second group 22B, to which the switching voltage is applied at a specific timing, may be spaced apart from each other as much as a distance so as not to be affected by an electrical field.

Figure 7:
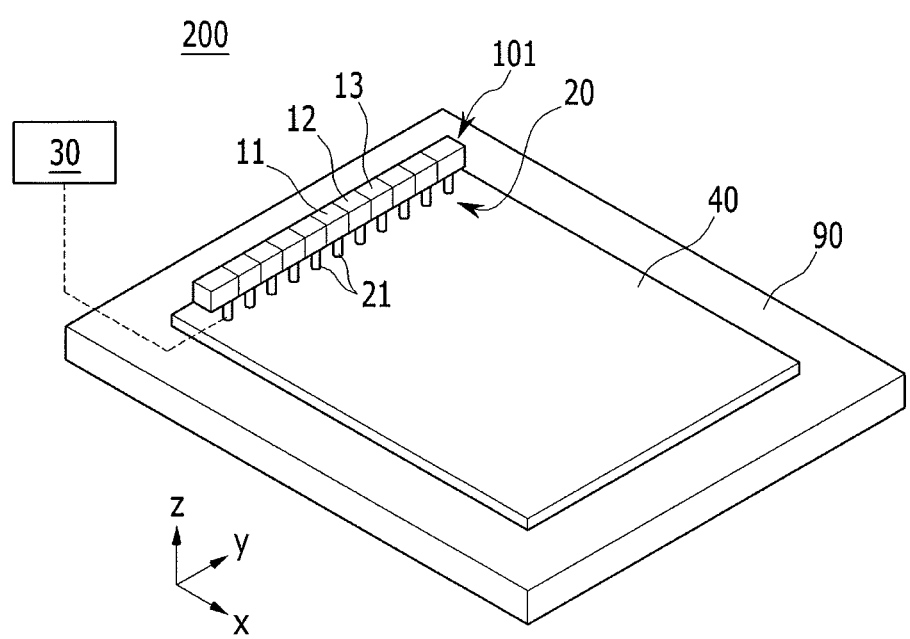
FIG. 7 is a schematic diagram schematically illustrating a device for forming a thin layer according to an exemplary embodiment.

FIG. 7 is a schematic diagram schematically illustrating a device for forming a thin layer according to a fifth exemplary embodiment.

Referring to FIG. 7, a device for forming a thin layer according to a fifth exemplary embodiment has the same configuration as the device for forming a thin layer according to any one exemplary embodiment among the first to fourth exemplary embodiments as described above, except that a plurality of vessels 101 in which different materials for forming a thin layer are included are provided and the plurality of nozzles 21 are each connected to any one of the plurality of vessels 101.

For example, the plurality of vessels 101 may include a first vessel 11 in which a material for forming a red light emitting layer is included, a second vessel 12 in which a material for forming a green light emitting layer is included, and a third vessel 13 in which a material for forming a blue light emitting layer is included. The first to third vessels are provided one by one and the plurality of nozzles may be connected to any one of the first to third vessels through a hose (not shown). On the other hand, the first to third vessels 11, 12, and 13 may be provided in plural, corresponding to the number of nozzles 21. FIG. 7 shows, by way of example, the second case.

The switching voltage generated from the pulse generator 30 may be sequentially or randomly applied to the plurality of nozzles 21. On the other hand, the plurality of nozzles 21 may be separated into at least two groups and the switching voltage may be sequentially or randomly applied to the nozzles of each group.

When forming the device 200 for forming a thin layer according to the fifth exemplary embodiment, the red, green, and blue light emitting layer may be simultaneously formed in one step and the multi-nozzle part is not separately provided for each color of the light emitting layer, thereby simplifying the device configuration.

Figure 8:
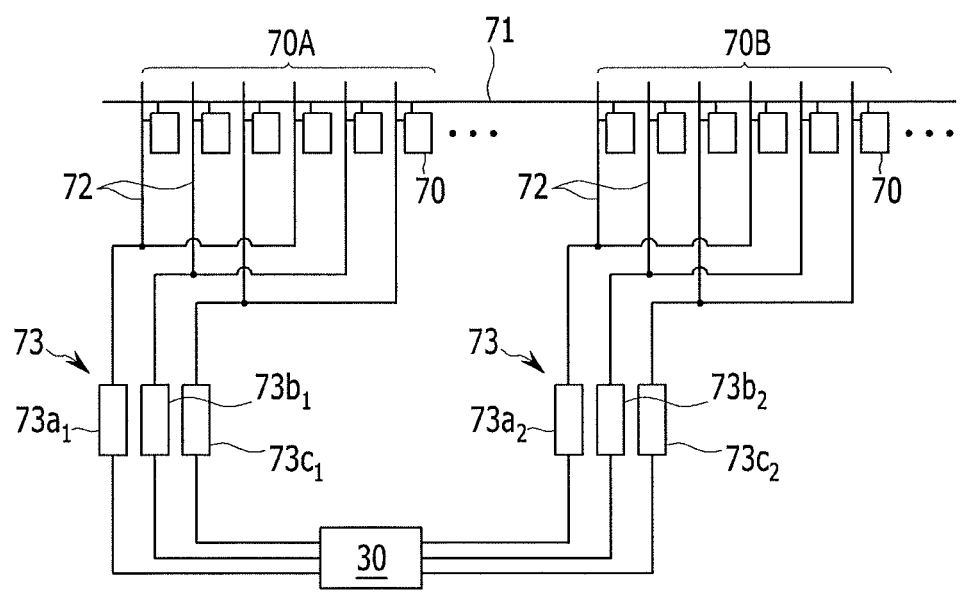
FIG. 8 is a schematic diagram schematically illustrating a pulse generator and sub-pixel areas on a substrate in a device for forming a thin layer according to an exemplary embodiment.
Figure 9:
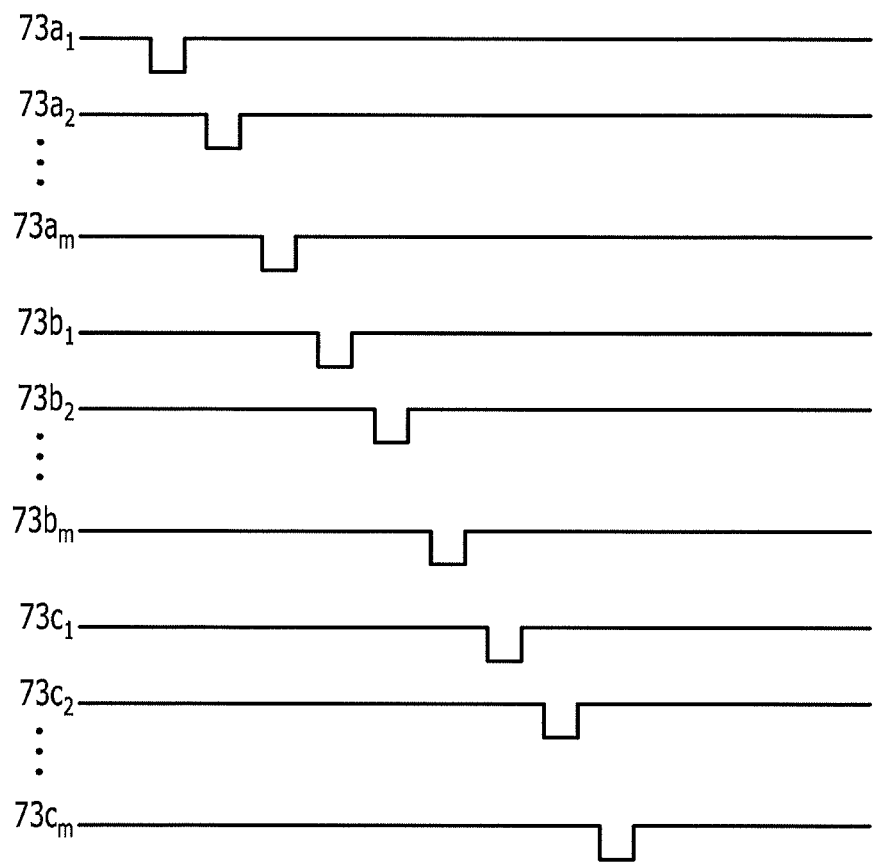
FIG. 9 is a diagram illustrating switching voltage applied from the pulse generator illustrated in FIG. 8 to a plurality of pad parts.

FIG. 8 is a schematic diagram schematically illustrating a pulse generator and sub-pixel areas on a substrate in a device for forming a thin layer according to a sixth exemplary embodiment and FIG. 9 is a diagram illustrating switching voltage applied from the pulse generator illustrated in FIG. 8 to a plurality of pad parts.

Referring to FIGS. 8 and 9, the device for forming a thin layer according to the sixth exemplary embodiment has the same configuration as the device for forming a thin layer according to the first exemplary embodiment as described above, except that the pulse generator 30 is electrically connected to the sub-pixel areas 70 on the substrate to apply the switching voltage to the sub-pixel areas 70.

Scan lines 71 and data line 72 are formed on the substrate to intersect each other and the sub-pixel areas 70 are disposed at each intersecting portion of the scan lines 71 and the data lines 72. Each sub-pixel area 70 is electrically connected to the scan lines 71 and the data lines 72. The plurality of pixel areas 70 may be separated into a plurality of groups along a direction parallel with the scan lines 71. FIG. 8 illustrates, by way of example, the first group 70A and the second group 70B among the plurality of groups.

The first group 70A and the second group 70B are each provided with a plurality of pad parts 73. In each of the first group 70A and the second group 70B, the data lines 72 of the sub-pixel areas 70 that are not adjacent to each other, are connected to any one of the pad parts 73.

In FIG. 8, the first group 70A and the second group 70B may each be provided with three pad parts $73a_1$ to $73c_1$ and $73a_2$ to $73c_2$, respectively. FIG. 8 illustrates, by way of example, the case in which the sub-pixel areas are 70 spaced from each other, having two sub-pixel areas disposed therebetween in each of the first group 70A and the second group 70B, and are connected to the same pad part of the pad parts $73a_1$ to $73c_1$ and $73a_2$ to $73c_2$. The number of pad parts 73 is not limited to the illustrated example. For example, when there are first to m groups that each include three pad parts, the pad parts 73 may include $73a_1$ to $73a_m$ pad parts, $73b_1$ to $73b_m$ pad parts, and $73c_1$ to $73c_m$ pad parts.

The pulse generator 30 is electrically connected to each of the plurality of pad parts $73a_1$ to $73c_1$ and $73a_2$ to $73c_2$, e.g., by a probe card (not shown). Further, the switching voltage for the specific pad part of the pad parts $73a_1$ to $73c_1$ and $73a_2$ to $73c_2$ may be sequentially or randomly applied all over the plurality of groups.

For example, the sub-pixel areas 70 are selected by applying scan voltage to the scan lines 71 in the sub-pixel areas 70 of one column facing the plurality of nozzles. Further, the sub-pixel areas 70 connected to the first pad part $73a_1$ in the first group 70A simultaneously receives the switching voltage at the time of applying the switching voltage to the first pad part $73a_1$ to generate the potential difference from the corresponding nozzle (not shown). In this way, the material for forming a thin layer is simultaneously discharged from the nozzle, thereby forming the thin layer on the sub-pixel areas. The switching voltage is sequentially or randomly applied to the first pad parts $73a_1$, $73a_2$, . . . .

Next, the switching voltage is sequentially or randomly applied to second pad parts $73b_1$, $73b_2$, . . . and the thin layer is formed in the sub-pixel areas 70 connected to the second pad parts $73b_1$, $73b_2$, . . . . Next, the switching voltage is sequentially or randomly applied to third pad parts $73c_1$, $73c_2$, . . . and the thin layer is formed in the sub-pixel areas 70 connected to the third pad parts $73c_1$, $73c_2$, . . . . In this way, the light emitting layer or the intermediate layer may be formed in the sub-pixel areas 70 that are located at one column.

The pad parts 73 used to form the thin layer are removed from the substrate after the thin layer is formed. That is, after the process of forming the thin layer, the substrate is cut and thus, a part of the substrate on which the pad parts 73 are located may be separated from the substrate on which the sub-pixel areas 70 are formed.

By way of summation and review, an organic light emitting diode display (OLED) includes electrodes (such as an anode and a cathode) and an emission layer disposed between the electrodes. For example, holes and electrons injected from the anode and the cathode are combined on the emission layer to generate excitons, and the excitons release energy, such that light is emitted. In order to emit light with high efficiency, intermediate layers (such as a hole injection layer, a hole transport layer, an electron transport layer, an electron injection layer, and the like) may be additionally disposed selectively between the electrodes and a light emitting layer.

An example of a method of forming a thin layer such as the light emitting layer, the intermediate layers, and the like, may include using a charge patterning technology. The charge patterning technology is a technology of printing a material for forming a thin layer by applying high voltage to a nozzle and maintaining a substrate at a relatively low potential to discharge a solution using a potential difference between the solution and the substrate.

The nozzle may be configured of a single nozzle, and the substrate and the nozzle may be disposed to be relatively movable with respect to each other so that sequentially printing of the thin layer forming material on the substrate may be realized. However, in this case, a process time is increased at the time of printing a large substrate and dryness between a pre-printing area and a post-printing area is different due to the processing time, such that the light emitting may be non-uniform.

In contrast, embodiments relate to a device for forming a thin layer that may be easily applied to mass production of a large substrate, and to an organic light emitting diode display and a method of manufacturing an organic light emitting diode display using the same. For example, embodiments relate to an effort to provide a device for forming a thin layer capable of improving drying uniformity between printing areas and increasing light emitting uniformity while reducing printing time and a method of manufacturing an organic light emitting diode (OLED) display using the same.

According to embodiments, it is possible to accurately print the material for forming a thin film at a desired location by minimizing electrical field interference between the adjacent nozzles while having a structure that includes multiple nozzles. Further, it is possible to effectively shorten the printing time and increase light emitting uniformity by reducing the dryness between a pre-printing area and a post-printing area, as compared with a single nozzle structure.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light emitting diode display, the method comprising:
    providing a multi-nozzle part including a plurality of nozzles on a substrate;
    providing a material for forming a thin layer, which is stored in a vessel, to the multi-nozzle part; and
    generating a switching voltage from a pulse generator and applying the switching voltage to one of the substrate and the multi-nozzle part to generate an instantaneous potential difference between at least one of the plurality of nozzles and the substrate;
    wherein at least one nozzle discharges the material for forming the thin layer due to the potential difference to form a thin layer on the substrate.

2. The method of manufacturing an organic light emitting diode display of claim 1, wherein the pulse generator sequentially or randomly applies the switching voltage to the plurality of nozzles.

3. The method of manufacturing an organic light emitting diode display of claim 1, wherein:
    the plurality of nozzles are separated into a plurality of groups, and
    the pulse generator sequentially or randomly applies the switching voltage to the plurality of nozzles in each of the plurality of groups.

4. The method of manufacturing an organic light emitting diode display of claim 1, wherein the pulse generator is electrically connected to sub-pixel areas of the substrate to apply the switching voltage to the sub-pixel areas.

* * * * *